(12) United States Patent
Yoon et al.

(10) Patent No.: US 7,964,483 B2
(45) Date of Patent: Jun. 21, 2011

(54) GROWTH METHOD FOR NITRIDE SEMICONDUCTOR EPITAXIAL LAYERS

(75) Inventors: Euijoon Yoon, Seoul (KR); Hyunseok Na, Shiga (JP)

(73) Assignee: Seoul National University Industry Foundation, Seoul (KR)

( * ) Notice: Subject to any disclaimer, the term of this patent is extended or adjusted under 35 U.S.C. 154(b) by 33 days.

(21) Appl. No.: 10/563,854

(22) PCT Filed: Jul. 7, 2004

(86) PCT No.: PCT/KR2004/001665
§ 371 (c)(1),
(2), (4) Date: Jun. 9, 2006

(87) PCT Pub. No.: WO2005/004212
PCT Pub. Date: Jan. 13, 2005

(65) Prior Publication Data
US 2006/0228901 A1    Oct. 12, 2006

(30) Foreign Application Priority Data

Jul. 8, 2003 (KR) .................. 10-2003-0046119

(51) Int. Cl.
*H01L 21/20* (2006.01)
*H01L 21/36* (2006.01)

(52) U.S. Cl. ............ 438/509; 438/47; 438/94; 438/483; 117/104; 257/E21.12; 257/E21.117; 257/E21.126

(58) Field of Classification Search ............... 438/483, 438/47, 94, 507, 510, 509; 257/13, 51, 85, 257/94, 184, E33.033, E21.116, E21.117, 257/E21.126, E33.034, E21.12; 117/104, 204

See application file for complete search history.

(56) References Cited

U.S. PATENT DOCUMENTS

| | | | |
|---|---|---|---|
| 6,071,795 A * | 6/2000 | Cheung et al. | 438/458 |
| 6,156,581 A * | 12/2000 | Vaudo et al. | 438/22 |
| 6,447,604 B1 * | 9/2002 | Flynn et al. | 117/89 |
| 6,455,340 B1 * | 9/2002 | Chua et al. | 438/31 |
| 6,656,269 B2 | 12/2003 | Tomioka | |
| 6,711,192 B1 * | 3/2004 | Chikuma et al. | 372/43.01 |
| 6,740,604 B2 * | 5/2004 | Kelly et al. | 438/795 |
| 6,750,158 B2 * | 6/2004 | Ogawa et al. | 438/795 |
| 2002/0173064 A1 | 11/2002 | Ogawa et al. | |

FOREIGN PATENT DOCUMENTS

| | | |
|---|---|---|
| DE | 10051465 | 5/2002 |
| JP | 2001-168045 A | 6/2001 |
| KR | 1020000074495 A | 12/2000 |

OTHER PUBLICATIONS

PCT International Search Report for PCT/KR2004/001665 mailed on Aug. 27, 2004.

* cited by examiner

*Primary Examiner* — Julio J Maldonado
(74) *Attorney, Agent, or Firm* — Husch Blackwell LLP

(57) ABSTRACT

The present invention relates to a method for growing a nitride semiconductor epitaxial layer, which comprises the steps of growing a second nitride semiconductor epitaxial layer on a first nitride semiconductor epitaxial layer at a first temperature, growing a third nitride semiconductor epitaxial layer on the second nitride semiconductor epitaxial layer at a second temperature, and releasing nitrogen from the second nitride semiconductor epitaxial layer by increasing a temperature to a third temperature higher than the second temperature, thereby, it is possible to lower the defect density of epitaxial layers and reduce warpage of a substrate.

12 Claims, 5 Drawing Sheets

Fig. 7
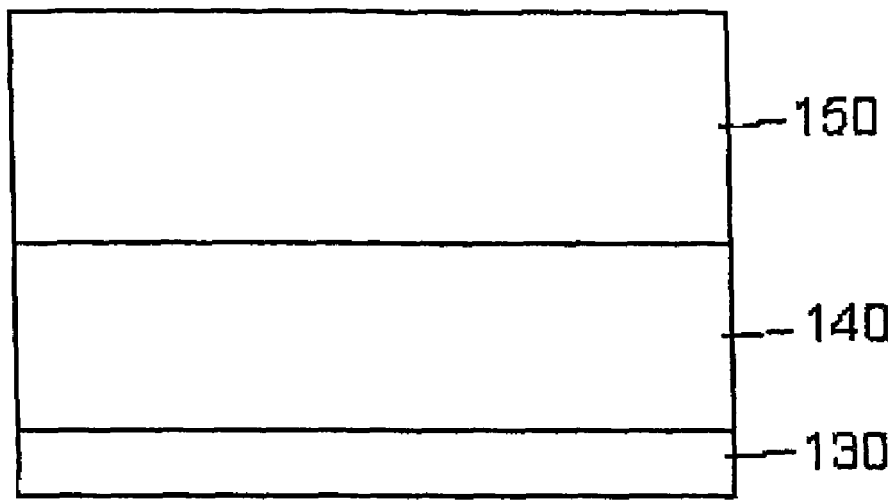
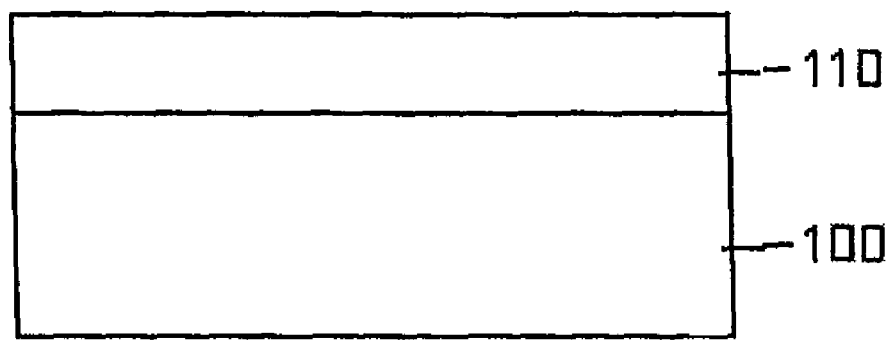
Fig. 8
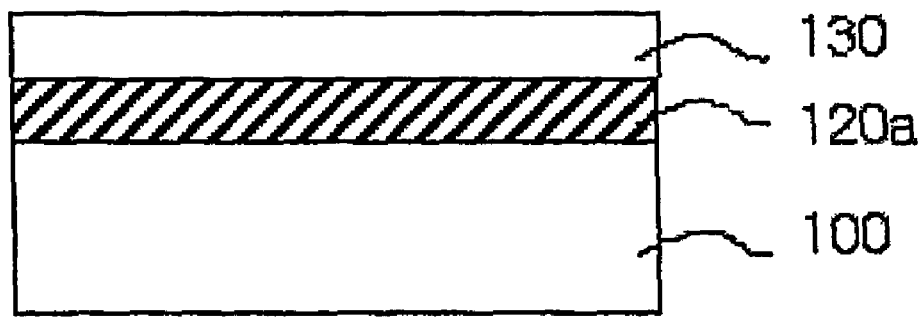

GROWTH METHOD FOR NITRIDE SEMICONDUCTOR EPITAXIAL LAYERS

CLAIM OF PRIORITY

This is a U.S. National Phase application under 35 U.S.C. §371 of International Patent Application No. PCT/KR2004/001665 filed on Jul. 7, 2004. The International Application was published in English on Jan. 13, 2005 as WO 2005/004212 A1 under PCT Article 21(2), which is incorporated by reference in its entirety.

TECHNICAL FIELD

The present invention relates to a method for growing a nitride semiconductor epitaxial layer, and more particularly, to a method for growing a nitride semiconductor epitaxial layer in which a substrate is used and which has no warpage and a low lattice defect density, whereby it is advantageous in fabricating optical devices and electronic devices of high efficiency.

BACKGROUND ART

In case of a nitride semiconductor epitaxial layer that is grown on a substrate, lots of crystal defects occur due to a mismatch of the lattice constant and a difference in the coefficient of thermal expansion. Warpage of the substrate is caused by internal stress. Moreover, the warpage of the substrate acts as hindrance in fabricating a large area substrate.

In order to overcome such mismatch between the substrate and the nitride semiconductor epitaxial layer, U.S. Pat. No. 4,855,249 discloses a technology in which an AlN buffer layer is grown on a sapphire substrate at low temperature and an $Al_xGa_{1-x}N$ ($0 \leq x < 1$) layer is then grown. Further, U.S. Pat. No. 5,290,393 discloses a technology in which an $Al_{1-x}Ga_xN$ ($0 < x \leq 1$) buffer layer is grown on a sapphire substrate at a temperature ranging between 200° C. and 900° C. and an $Al_{1-x}Ga_xN$ ($0 < x \leq 1$) layer is then grown at a temperature ranging between 900° C. and 1150° C.

Furthermore, U.S. Pat. No. 6,051,847 discloses a technology in which in a process wherein a buffer layer containing indium is grown on a sapphire substrate and the GaN based compound semiconductor layer is then grown on the buffer layer, indium contained in the buffer layer is diffused into a GaN based compound semiconductor layer.

Meanwhile, in order to solve such mismatch, technologies using a substrate made of GaN have been proposed. However, these methods have a problem in that light emitting devices using the GaN substrate have not yet been commercialized due to difficulty in growing a GaN bulk and a high cost spent in the growth.

DISCLOSURE

Technical Problem

Accordingly, the present invention has been made in view of the above problems, and it is an object of the present invention to provide a method for growing a nitride semiconductor epitaxial layer wherein a nitride semiconductor epitaxial layer with low defects for fabricating a nitride based optical device and electronic device of high efficiency can be grown by reducing warpage of a substrate due to stress.

Technical Solution

To achieve the above object, according to one aspect of the present invention, there is provided a method for growing a nitride semiconductor epitaxial layer, including the steps of growing a second nitride semiconductor epitaxial layer on a first nitride semiconductor epitaxial layer at a first temperature, growing a third nitride semiconductor epitaxial layer on the second nitride semiconductor epitaxial layer at a second temperature, and releasing nitrogen from the second nitride semiconductor epitaxial layer by increasing a temperature to a third temperature higher than the second temperature.

Furthermore, in the method for growing the nitride semiconductor epitaxial layer according to the present invention, the first and third nitride semiconductor epitaxial layers are made of a material whose equilibrium vapor pressure of nitrogen is lower than that of the second nitride semiconductor epitaxial layer.

In addition, the method for growing the nitride semiconductor epitaxial layer according to the present invention additionally includes a step of separating a part including the first nitride semiconductor epitaxial layer and the other part including the third nitride semiconductor epitaxial layer from each other.

According to another aspect of the present invention, there is also provided a method for growing a nitride semiconductor epitaxial layer, including a first step of growing a first nitride semiconductor epitaxial layer containing indium at a first temperature, a second step of growing a second nitride semiconductor epitaxial layer whose equilibrium vapor pressure of nitrogen is lower than that of the first nitride semiconductor epitaxial layer, on the first nitride semiconductor epitaxial layer at a second temperature, and a third step of releasing nitrogen from the first nitride semiconductor epitaxial layer by increasing a temperature to a third temperature higher than the second temperature to convert the first nitride semiconductor epitaxial layer into a metal layer.

It is preferred that a layer which is located below the first nitride semiconductor epitaxial layer may be a substrate or a nitride semiconductor epitaxial layer.

ADVANTAGEOUS EFFECTS

According to the present invention, since stress caused by the mismatch between a substrate and nitride semiconductor epitaxial layers is absorbed by a metal layer, stress applied to the nitride semiconductor epitaxial layers is relatively reduced. Therefore, it is possible to lower the defect density of epitaxial layers and reduce warpage of a substrate.

According to the present invention, after nitride semiconductor epitaxial layers comprising a metal layer have been grown, the metal layer may be eliminated. Therefore, a GaN based substrate for growing the nitride semiconductor epitaxial layers can be obtained.

According to the present invention, warpage of a substrate is reduced by providing an indium-containing metal layer. Therefore, a new direction for fabricating a large area substrate with a diameter larger than 2 inches is presented.

DESCRIPTION OF DRAWINGS

FIGS. 6 and 7 are cross-sectional views showing a method for growing a nitride semiconductor epitaxial layer according to a second embodiment of the present invention; and FIG. 8 is a view for explaining another embodiment of the present invention.

MODE FOR INVENTION

The present invention will now be described in detail in connection with preferred embodiments with reference to the accompanying drawings.

FIGS. 1 to 4 are cross-sectional views showing a method for growing a nitride semiconductor epitaxial layer according to a first embodiment of the present invention. FIG. 5 shows a change in the equilibrium vapor pressure of nitrogen in the nitride semiconductor epitaxial layers depending on a temperature.

Figure 1:
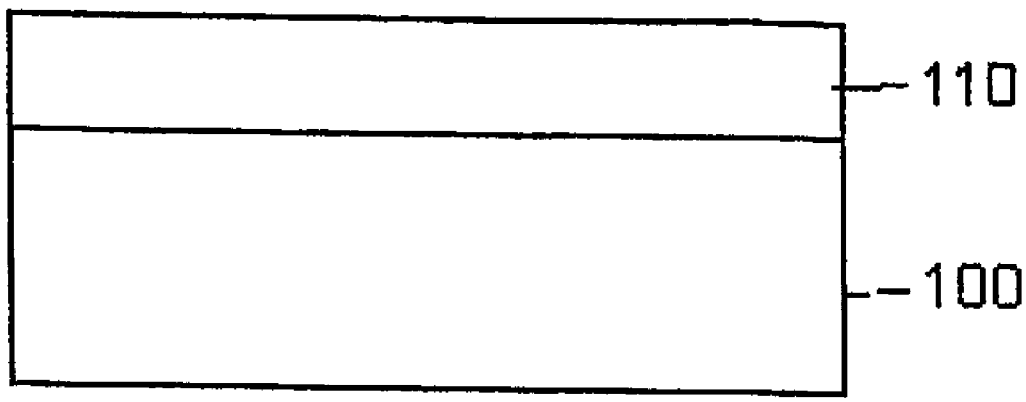
FIGS. 1 to 4 are cross-sectional views showing a method for growing a nitride semiconductor epitaxial layer according to a first embodiment of the present invention.

Referring to FIG. 1, a nitride semiconductor epitaxial layer 110 is grown on a substrate 100. The substrate 100 may be any kind of substrate such as a semiconductor substrate, an oxide substrate or a boride substrate. The substrate 100 may be a Si, SiC, GaAs or $ZrB_2$ substrate and preferably is an $Al_2O_3$ substrate. However, it is to be noted that any kind of substrate can be used if it is a single crystal substrate on which a nitride based semiconductor epitaxial layer can be grown, and thus the substrate 100 is not limited to the above. The nitride semiconductor epitaxial layer 110 consists of a nitride semiconductor containing at least one of gallium and aluminum. It is preferred that the nitride semiconductor epitaxial layer 110 is formed using $Al_xGa_{1-x}N$ ($0 \leq x \leq 1$) and can have a thickness of 1 μm or more. In a preferred embodiment, the nitride semiconductor epitaxial layer 110 is GaN that is formed by two steps of growing a low-temperature buffer layer and growing a high-temperature layer on the low-temperature buffer layer. It is, however, to be understood that any other nitride semiconductors can be grown on the substrate 100.

Figure 2:
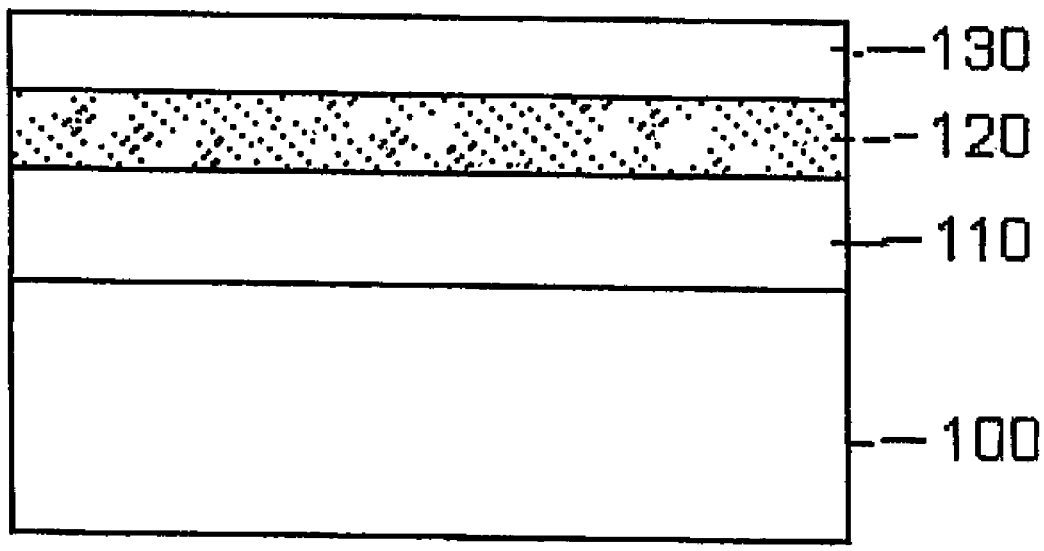

Referring to FIG. 2, a nitride semiconductor epitaxial layer 120 that can be converted to a metal phase if the temperature is raised is grown on the nitride semiconductor epitaxial layer 110. The nitride semiconductor epitaxial layer 120 consists of a nitride semiconductor containing indium and preferably consists of $In_xGa_{1-x}N$ ($0.5 < x \leq 1$). A step of growing the nitride semiconductor epitaxial layer 120 can be performed at a relatively low temperature of 300° C. to 800° C. Thus, after the nitride semiconductor epitaxial layer 110 consisting of $Al_xGa_{1-x}N$ ($0 \leq x \leq 1$) is grown at a growth temperature, the growth temperature is lowered, then the nitride semiconductor epitaxial layer 120, preferably an InN layer is grown.

Then, in a state where the nitride semiconductor epitaxial layer 120 is kept, a nitride semiconductor epitaxial layer 130 is grown on the nitride semiconductor epitaxial layer 120, for example, at a temperature similar to a growth temperature in the step of growing the nitride semiconductor epitaxial layer 120, i.e., at a temperature of 300° C. to 800° C. in this embodiment. The nitride semiconductor epitaxial layer 130 is composed of a nitride semiconductor containing at least one of gallium and aluminum, preferably $Al_xGa_{1-x}N$ ($0 \leq x \leq 1$) and is grown using GaN in this embodiment. Conversion of the nitride semiconductor epitaxial layer 120 into a metal layer is performed by releasing nitrogen from the nitride semiconductor epitaxial layer 120 using a difference in the equilibrium vapor pressure of nitrogen within the nitride semiconductor epitaxial layer 120 and the nitride semiconductor epitaxial layers 110 and 130.

If the thickness of the nitride semiconductor epitaxial layer 120 is too thin, a metal layer for relieving stress cannot be formed due to interdiffusion with the nitride semiconductor epitaxial layers 110 and 130 at the top and is bottom of the nitride semiconductor epitaxial layer 120. Meanwhile, if the thickness of the nitride semiconductor epitaxial layer 120 is too thick, the occurrence of stress and defects in the nitride semiconductor epitaxial layer 120 can be problematic. Accordingly, it is necessary to grow the nitride semiconductor epitaxial layer 120 with a thickness that allows the metal layer to exist during the time period when a subsequent thick nitride semiconductor epitaxial layer is grown.

The nitride semiconductor epitaxial layer 130 serves as a seed for a nitride semiconductor epitaxial layer that will be formed subsequently. If the nitride semiconductor epitaxial layer 130 is too thin, crystalloid can be degraded when the nitride semiconductor epitaxial layer 120 is converted to a metal phase in a subsequent process. Also, there is a possibility that the nitride semiconductor epitaxial layer 130 cannot serve as a seed sufficiently due to a change in the lattice constant, etc. resulting from interdiffusion with the metal layer. Meanwhile, if the thickness of the nitride semiconductor epitaxial layer 130 is too thick, a process wherein nitrogen is released from the nitride semiconductor epitaxial layer 120 becomes slow. Thus, there is a possibility that the speed of conversion to a metal layer may be slow. For this reason, the nitride semiconductor epitaxial layer 130 is grown in thickness of about 1 nm to 100 nm.

Figure 3:
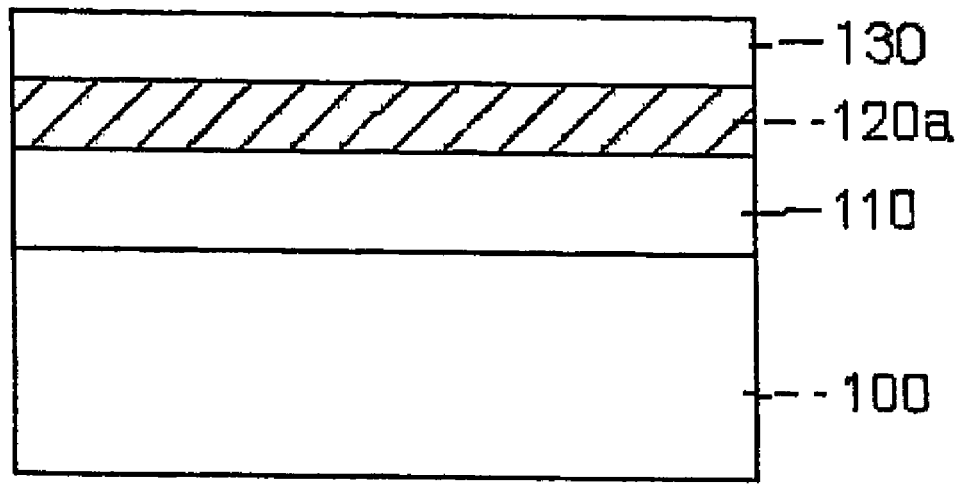

Referring to FIG. 3, a temperature is raised so that the nitride semiconductor epitaxial layer 120 can be converted to a metal phase. As described above, nitrogen escapes only from the nitride semiconductor epitaxial layer 120 made of InxGa1-xN, due to a difference in the equilibrium vapor pressure of nitrogen. Thus, the nitride semiconductor epitaxial layer 120 is converted to a metal layer 120a. At this time, a temperature can be raised to about 900° C. or more. Referring to FIG. 5, the nitride semiconductor epitaxial layer 120, for example, InN layer can be converted to an In metal phase due to a difference in the equilibrium vapor pressure if a temperature is 900° C. or more. As the melting point of an In metal is about 156.6° C., the In metal keeps the liquid state after it is converted to the metal phase. As the boiling point of the In metal is about 2074° C., the In metal is not boiled over even in a subsequent growth temperature but keeps the liquid phase. On the other hand, the nitride semiconductor epitaxial layers 110 and 130 formed using GaN have the equilibrium vapor pressure of nitrogen that is lower than InN. Thus, nitrogen is not released from the nitride semiconductor epitaxial layers 110 and 130, which thus keep the solid phase.

In the above, in a state where the nitride semiconductor epitaxial layer 130 covers the entire surface of the nitride semiconductor epitaxial layer 120, the nitride semiconductor epitaxial layer 120 is converted to the metal layer 120a. However, after the nitride semiconductor epitaxial layer 130 is patterned to have an appropriate shape, the nitride semiconductor epitaxial layer 120 can be converted to the metal layer 120a. If the nitride semiconductor epitaxial layer 130 is patterned to have an appropriate shape, some of the surface of the nitride semiconductor epitaxial layer 120 is exposed to environment of the growth chamber. It is thus possible to make the process of converting to the metal layer faster since discharge of nitrogen becomes faster.

Figure 4:
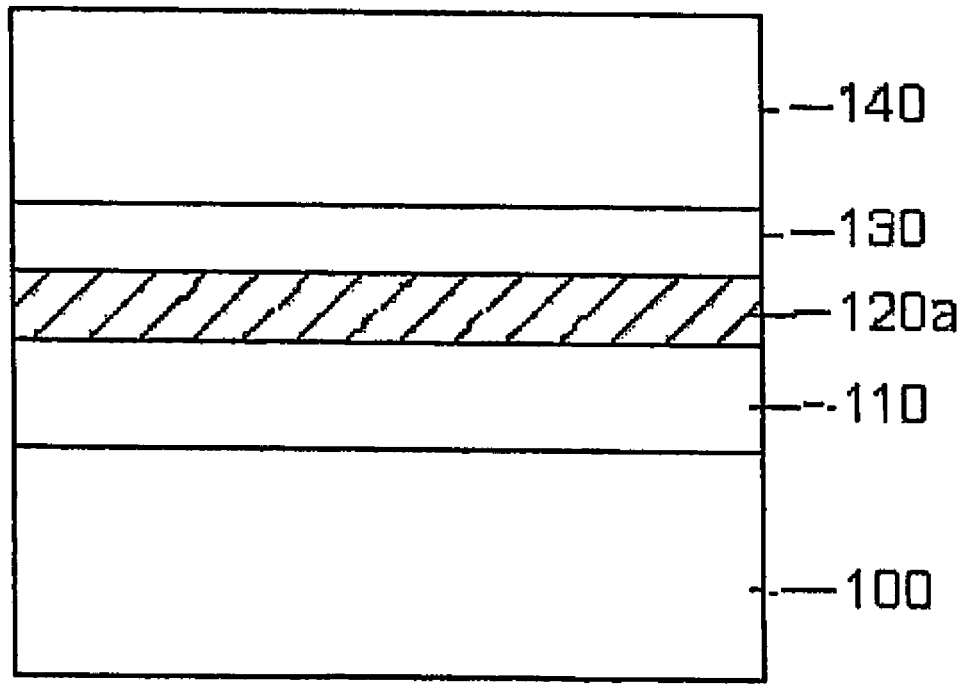
Figure 5:
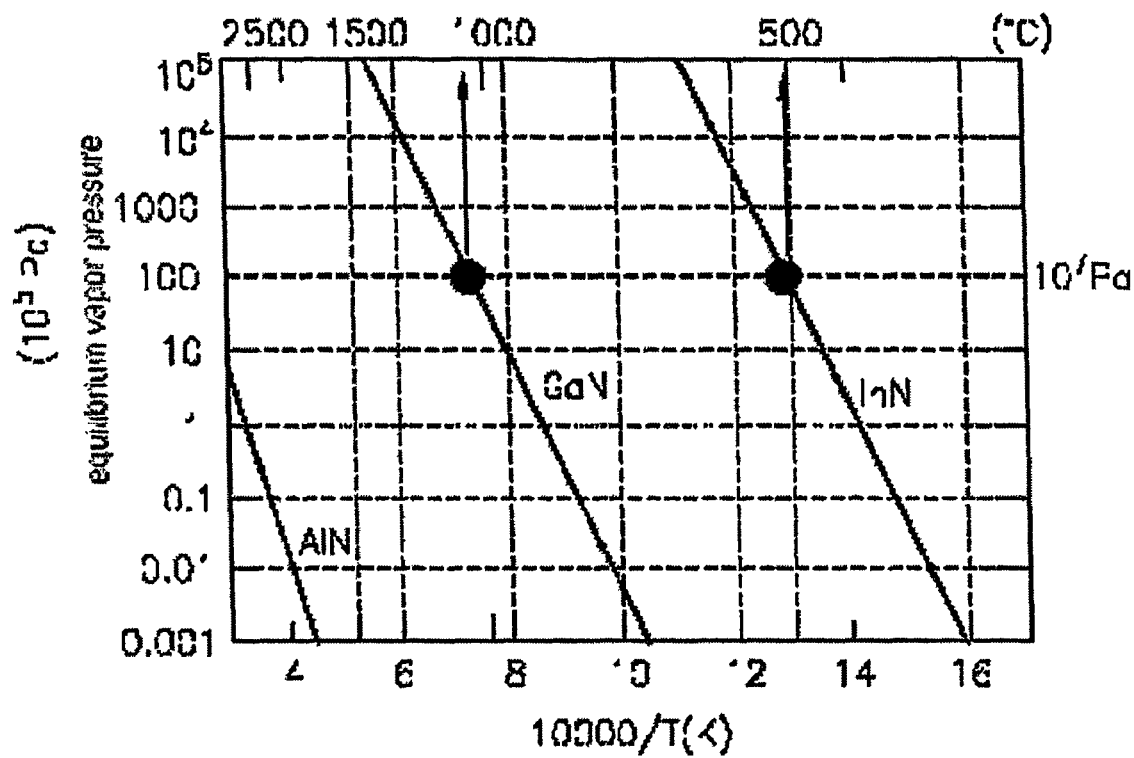
FIG. 5 shows a change in the equilibrium vapor pressure of nitrogen in the nitride semiconductor epitaxial layers depending on a temperature.

Referring next to FIG. 4, a nitride epitaxial layer 140 is grown on the nitride semiconductor epitaxial layer 130 which acts as a seed layer while stress generated upon growth is mitigated through the metal layer 120a. As the metal layer 120a that is converted from the nitride semiconductor epitaxial layer 120 absorbs stress, it can reduce warpage of a nitride semiconductor epitaxial layer that is subsequently grown at a high temperature.

Figure 6:
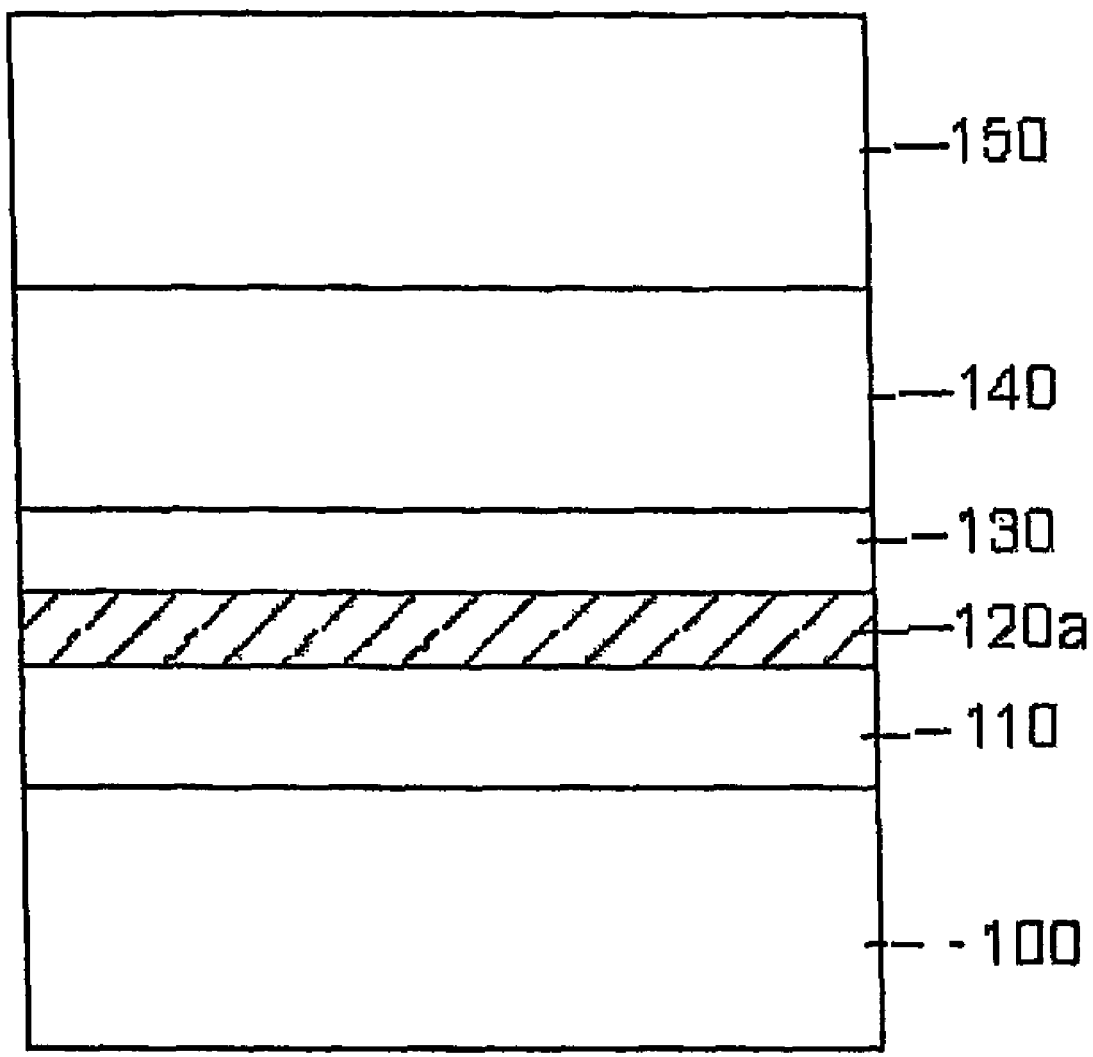

FIGS. 6 and 7 are cross-sectional views showing a method for growing a nitride semiconductor epitaxial layer according to a second embodiment of the present invention.

Referring to FIG. 6 and FIG. 7, after the step of FIG. 4 has been performed, a carrier substrate 150 is attached on the nitride semiconductor epitaxial layer 140, thus securing the mechanical force. A part including the substrate 100 and the other part including the nitride semiconductor epitaxial layer 140 are separated from each other by removing the interposed metal layer 120a using an acid solution. In a conventional method, in order to separate the substrate, a complex process such as a separating process by irradiation of laser beam and/or a mechanical polishing process has been used. In the present invention, however, the substrate can be easily separated by selectively etching only the interposed metal layer in an acid solution. Also, if the interface between the metal layer 120a and the nitride semiconductor epitaxial layer 130 is in an atomic layer level, an additional chemical mechanical polishing (CMP) process is not required after the substrate has been separated. After separated, the other part including the nitride semiconductor epitaxial layer 140 can be used as a new substrate.

Alternatively, the substrate can be separated as a free standing substrate by selectively etching only the metal layer 120a without using the carrier substrate 150.

FIG. 8 is a view for explaining another embodiment of the present invention. The metal layer 120a is formed directly on the substrate 100, but not on the nitride semiconductor epitaxial layer 110. In this embodiment, the metal layer 120a is formed and another nitride semiconductor epitaxial layer is then formed on the nitride semiconductor epitaxial layer 130 in the same manner as in the embodiment of FIG. 2, except that the growth of the nitride semiconductor epitaxial layer 110 is omitted. Even in this embodiment, the nitride semiconductor epitaxial layer 120 consists of a nitride semiconductor containing indium, preferably InxGa1-xN (0.5<x≦1), more preferably InN. The nitride semiconductor epitaxial layer 130 is a nitride semiconductor containing at least one of gallium and aluminum, preferably $Al_xGa_{1-x}N$ (0≦x≦1), more preferably GaN.

While the present invention has been described with reference to particular illustrative embodiments, it is not to be restricted by the embodiments. It is to be appreciated that those skilled in the art can change or modify the embodiments without departing from the scope and spirit of the present is invention.

INDUSTRIAL APPLICABILITY

The present invention can be applied to light emitting devices such as a light emitting diode and a laser diode by growing a plurality of nitride semiconductors layer including an active layer for generating light by recombination of electrons and holes, on the metal layer.

The invention claimed is:

1. A growth method for growing a nitride semiconductor epitaxial layer comprising:
 a first step of growing a second nitride semiconductor epitaxial layer on a first nitride semiconductor epitaxial layer at a first temperature;
 a second step of growing a third nitride semiconductor epitaxial layer on the second nitride semiconductor epitaxial layer at a second temperature;
 a third step of releasing nitrogen from the second nitride semiconductor epitaxial layer by collectively increasing a temperature of the first nitride semiconductor epitaxial layer, nitride semiconductor epitaxial layer, and the third nitride semiconductor epitaxial layer within a growth chamber,
 wherein the second nitride semiconductor epitaxial layer releases nitrogen when its temperature reaches a third temperature higher than the second temperature,
 wherein each of the first nitride semiconductor epitaxial layer and third nitride semiconductor epitaxial layer is made of a material whose equilibrium vapor pressure of nitrogen is lower than that of the second nitride semiconductor epitaxial layer and
 wherein the releasing nitrogen of the third step is made using the difference in the equilibrium vapor pressure of nitrogen at the third temperature; and
 a fourth step of growing a fourth nitride semiconductor epitaxial layer on the third nitride semiconductor epitaxial layer after releasing nitrogen from the second nitride semiconductor epitaxial layer and before separating a first part which includes the first nitride semiconductor epitaxial layer.

2. The growth method of nitride semiconductor epitaxial layer of claim 1, the second nitride semiconductor epitaxial layer is converted into a metal layer in the third step.

3. The growth method of nitride semiconductor epitaxial layer of claim 2, further comprising the step of:
 separating the first part from the second part.

4. The growth method of nitride semiconductor epitaxial layer of claim 1, wherein the second nitride semiconductor epitaxial layer is made of InxGa1-xN (0.5<x≦1).

5. The growth method of nitride semiconductor epitaxial layer of claim 1, wherein the first and third nitride semiconductor epitaxial layers are made of $Al_xGa_{1-x}N$ (0<x≦1).

6. The growth method of nitride semiconductor epitaxial layer of claim 1, wherein the first temperature in the first step is in a range of 300° C. to 800° C.

7. The growth method of nitride semiconductor epitaxial layer of claim 1, wherein the second temperature in the second step is in a range of 300° C. to 800° C.

8. The growth method of nitride semiconductor epitaxial layer of claim 1, wherein the third nitride semiconductor epitaxial layer has a thickness in a range of 1 nm to 100 nm.

9. The growth method of nitride semiconductor epitaxial layer of claim 1, wherein the third temperature in the third step is 900° C. or more.

10. The growth method of nitride semiconductor epitaxial layer of claim 1, wherein the first nitride semiconductor epitaxial layer is grown on a substrate.

11. The growth method of nitride semiconductor epitaxial layer of claim 10, wherein the first nitride semiconductor epitaxial layer comprises a buffer layer grown at a relatively low temperature and an un-doped GaN layer grown on the buffer layer.

12. The growth method of nitride semiconductor epitaxial layer of claim 1, further comprising:
 a step of patterning the third nitride semiconductor epitaxial layer, prior to the third step.

* * * * *